United States Patent
Wihl et al.

(10) Patent No.: US 7,027,635 B1
(45) Date of Patent: Apr. 11, 2006

(54) MULTIPLE DESIGN DATABASE LAYER INSPECTION

(75) Inventors: Mark J. Wihl, Tracy, CA (US); George Q. Chen, Fremont, CA (US); Jun Ye, Palo Alto, CA (US); Lih-Huah Yiin, Mountain View, CA (US); Pei-Chun Chiang, Cupertino, CA (US)

(73) Assignee: KLA-Tencor Technologies Corporation, San Jose, CA (US)

( * ) Notice: Subject to any disclaimer, the term of this patent is extended or adjusted under 35 U.S.C. 154(b) by 674 days.

(21) Appl. No.: 10/193,965

(22) Filed: Jul. 10, 2002

Related U.S. Application Data

(60) Provisional application No. 60/341,558, filed on Dec. 10, 2001.

(51) Int. Cl.
*G06K 9/00* (2006.01)

(52) U.S. Cl. .................................. 382/144; 382/145

(58) Field of Classification Search ............... 382/144, 382/145
See application file for complete search history.

(56) References Cited

U.S. PATENT DOCUMENTS

| | | | |
|---|---|---|---|
| 5,441,834 A * | 8/1995 | Takekuma et al. | 430/5 |
| 5,481,624 A * | 1/1996 | Kamon | 382/144 |
| 6,282,309 B1 * | 8/2001 | Emery | 382/145 |
| 6,327,033 B1 * | 12/2001 | Ferguson et al. | 356/394 |
| 6,396,945 B1 * | 5/2002 | Ishii | 382/149 |
| 6,691,052 B1 * | 2/2004 | Maurer | 702/81 |
| 2002/0036772 A1 * | 3/2002 | Koizumi et al. | 356/237.5 |
| 2002/0186879 A1 * | 12/2002 | Hemar et al. | 382/149 |

FOREIGN PATENT DOCUMENTS

JP 02002287327 A * 10/2002

* cited by examiner

*Primary Examiner*—Jingge Wu
*Assistant Examiner*—Jordan Kuhn
(74) *Attorney, Agent, or Firm*—Beyer Weaver & Thomas LLP

(57) ABSTRACT

Techniques that use the design databases used in each of the expose/etch steps during construction of phase shift masks are described. A model or reference image is rendered, accounting for systematic variations, from the design databases to represent what a layer of the PSM should look like after processing. The reference image is compared to an optically acquired image of a specimen phase shift mask to find defects. The technique of the present invention can be used to inspect EAPSM, APSM and tritone masks. The technique inspects all layers in one pass and is therefore more efficient.

39 Claims, 11 Drawing Sheets

MULTIPLE DESIGN DATABASE LAYER INSPECTION

This application claims priority of U.S. Provisional Patent Application No. 60/341,558, filed Dec. 10, 2001 entitled "Multiple Design Database Layer Inspection," which is hereby incorporated by reference.

FIELD OF THE INVENTION

The present invention relates generally to photomask inspection, and more specifically to multi-layer photomask inspection.

BACKGROUND OF THE INVENTION

Integrated circuit devices are typically manufactured using a combination of etching and deposition processes. Patterned photoresist layers are used to selectively etch the semiconductor substrates used to make the IC devices. Light blocking masks are used to form the patterns in the photoresist layers. A typical light blocking mask is made of a quartz (glass) substrate that supports a patterned layer of opaque material, such as chrome. Phase shift masks, or PSM, are one type of light blocking mask. By placing a PSM over a photoresist layer, light passes through the quartz except for the regions blocked by opaque material. Ultimately, the PSM facilitates the forming of a pattern into a solid layer of photoresist material.

In a similar manner with respect to integrated circuit devices, light blocking masks are manufactured by etching processes. Specifically, the pattern of the opaque material on the quartz substrate is formed through selective etching processes. Of particular importance to this disclosure, which will be explained later, are the computer database files that describe the photoresist patterns (or the masks used to created the patterns) that are used to create the patterned opaque material layers. Generally, a single database file describes a single pattern to be formed in an opaque material layer. The light blocking masks must be made with precision since they ultimately affect the formation of the integrated circuits. Inspection techniques have been developed to ensure the precision of the light blocking masks. One inspection technique compares an actual optical image of the light-blocking mask against a model image of what the mask should look like. The model image of the light blocking mask is generated from the database file used to create the opaque patterned layer.

Development efforts in semiconductor manufacturing techniques have brought about improved light blocking masks, such as embedded attenuating phase shift masks (EAPSM) and alternating phase shift masks (APSM). These masks are generally referred to as advanced phase shift masks. Also referred to as "weak phase shift masks" and "strong phase shift masks," respectively, these light blocking masks are designed to create sharper boundaries between areas on a substrate that are to be exposed and those that are not to be exposed to light. Structurally, these new masks are different because they have more than two characteristic layers, as opposed to conventional light blocking layers, which have only two layers (a quartz and an opaque layer). It follows that conventional light blocking layers are sometimes referred to as binary masks.

FIGS. 1A–1E and 2A–2D are now described to illustrate APSM and tritone masks, respectively, and how they are manufactured. FIGS. 1A–1E illustrate side plan, cross-sectional views of an APSM mask wherein each of the FIGS. track the general phases of its manufacturing process. APSM is so named for the reason that its adjacent apertures alternate the phase of the light rays that pass through the mask.

FIG. 1E illustrates the final and operational configuration of an APSM 100. APSM 100 is formed of a quartz substrate 102 on which a layer of opaque material 104 is deposited. Two openings 106 and 108 have been formed within the opaque layer 104 through which light from a light source can reach an underlying photoresist layer. Opening 106 leads to a well 110 within quartz layer 102, and opening 108 leads to a well 112. Well 110 is referred to as a 180 degree well since its depth within the quartz layer tends to shift the wavelength of the passing light rays by 180 degrees. Well 112 is referred to as the zero degree well since it does not tend to shift the phase of the passing light. In alternative embodiments, well 110 and 112 can be configured to shift the light rays a different amount while maintaining a relative 180 degree phase difference between the light of each well. Since the light waves passing through wells 110 and 112 are 180 degrees out of phase, they tend to cancel each other out when they converge beneath opaque region 104'. By causing the light waves to cancel each other out, wells 110 and 112 create a darker region underneath opaque region 104'. At the same time, a sharper boundary is obtained between areas that are exposed and areas that are not exposed to light.

FIGS. 1A–1D describe the manufacturing process for APSM masks. Of most significance is that APSM's are manufactured using two etching steps. FIG. 1A illustrates a side plan, cross-sectional view of the initial layer of quartz 102 and the initial layer of opaque material 104. A common material for the opaque material is chrome. FIG. 1B shows the layers of FIG. 1A after openings 106 and 108 were formed in the opaque material layer 104. Also shown in FIG. 1B is a photoresist layer 114 that is used to etch openings 106 and 108. The pattern in photoresist layer 114 is formed using a computer database file, which contains the information required to form the pattern. This database file can be referred to as the critical layer database since it serves the important role of positioning the openings within the opaque layer 104. FIG. 1C illustrates the layers of FIG. 1B after etching was performed to create the 180-degree well 110. Also shown in FIG. 1C is a photoresist layer 116 that is used to etch 180 degree well 110. The pattern in photoresist layer 116 is formed using a respective computer database file that can be referred to as the second layer database since it contains information to create the second layer of photoresist in the fabrication process. Note that the opening within photoresist layer 116 is much larger than opening 106 of the opaque layer 104. The opaque material layer 104 itself serves as a etch resistant mask, therefore, the most significant role of photoresist layer 104 is to cover the openings that are not to be etched to be 180 degree wells. FIG. 1D illustrates the layers after the quartz layer beneath both openings 106 and 108 are etched during a single etching process. The 180-degree phase shifting characteristic of wells 110 and 112 are maintained since they undergo an equal amount of etching. A wet etch is used after all wells are formed so that impurities are removed. As an additional result, the isotropic nature of wet etching cause some quartz to be removed underneath the edges of the opaque material. In some embodiments of APSM, the etching of FIG. 1D is not required. In these embodiments, some openings do not have a well embedded within quartz layer 102.

FIGS. 2A–2D illustrate side plan, cross-sectional views of a tritone mask 200, wherein each of the FIGS. tracks the general phases of its manufacturing process. FIG. 2D illustrates tritone mask 200 after the manufacturing processes have been completed. The tritone mask 200 includes a quartz substrate 202, an attenuator layer 204, and an opaque material layer 206. Attenuator layer 204 is made of material that affects light transmission and shifts the phase of passing light. Opaque layer 206 blocks light rays and, again, can be a material such as chrome. The fragment of tritone mask 200 in FIG. 2D contains two openings 208 and 210 in opaque layer 206. Openings 208 and 210 are separated by a stacked segment, or an island, of attenuator 204' and opaque material 206'. The edges of opaque material 206' do not extend to the edges of attenuator 204'. Opaque material 206' blocks light directed towards a region below. The edges of attenuator 204' that extend beyond opaque material 206' are designed to change the transmission and phase of passing light so that a sharp boundary between areas exposed to light and those areas that are not exposed light is achieved.

FIGS. 2A–2C illustrate the process through which tritone mask 200 is manufactured. FIG. 2A illustrates the initial layers of quartz 202, attenuator 204, and opaque material 206. FIG. 2B shows a patterned photoresist layer 212 on top of opaque layer 206, within which has been etched openings 208 and 210. The pattern within photoresist layer 212 is established with a computer database file referred to as the critical layer database. FIG. 2C shows a photoresist layer 214 having a new pattern. The new pattern of photoresist layer 214 is established with a respective database file referred to as the second layer database.

While APSM and tritone masks improve the process of selectively exposing semiconductor substrates to light, they also need to be inspected for structural precision. For example, APSM masks must be inspected to ensure that openings for each of the 180 degree and zero degree wells are properly formed and positioned. Specifically, it is important to determine the location of edges of each opening in the opaque layer. Note that for APSM, registration information for alignment between the holes and the wells is not necessary since the holes in the opaque layer determine the location of the wells. For tritone masks, the positioning of three types of edges can be measured: the opaque edge above the attenuator, the attenuator above the quartz, and the opaque edge above the quartz layer. Determining the accuracy of the opaque edge above the attenuator edge tends to be less critical.

Currently, database inspection techniques for binary masks can be applied to APSM and tritone masks but often with severe restrictions on sensitivity and/or throughput. Binary mask inspection techniques are designed to determine the position of one type of edge and uses only one database file. To utilize these techniques for APSM and tritone masks, multiple inspection passes over the masks would be required. Therefore, these inspection processes have low throughput rates. Also, special settings are required during each pass to inspect each type of edge. For example, specific light calibration, edge model and inspection area settings are likely required for each type of edge. In many cases, the proximity of mixed edge types to each other will make the technique of applying multiple passes of a binary inspection algorithm impractical.

In view of the foregoing, an inspection technique capable of efficiently inspecting advanced phase shift masks would be desirable.

BRIEF SUMMARY OF THE INVENTION

The present invention pertains to techniques that use the design databases used in each of the expose/etch steps during construction of phase shift masks. A model or reference image is rendered, accounting for systematic variations, from the design databases to represent what a layer of the PSM should look like after processing. The reference image is compared to an optically acquired image of a specimen PSM to find defects. The technique uses the various design databases used to create a PSM to learn, render images, and combine different edge characteristics to detect defects. The technique inspects all layers in one pass and is therefore very efficient.

One aspect of the invention pertains to a method for inspecting an advanced PSM. The method involves receiving a first database file and rendering a first image of a first photoresist layer, conditioning the first image according to a first set of transformation functions to generate a first critical layer model image, conditioning the first image according to a second set of transformation functions to generate a second critical layer model image, receiving a second database file and rendering a second image of a second photoresist layer, aligning the first critical layer model image, the second critical layer model image, and the second image with an optical image of the advanced phase shift mask, determining a first differential value between the first critical layer model image and the optical image, determining a second differential value between the second critical layer model image and the optical image, according a respective weight to the first and second differential values, and generating a weighted differential value, and comparing the weighted value against a threshold value to determine if a defect exists. In another aspect of this method, the image corresponding to the second database file can be conditioned by the same second set of transformation functions or by a third set of transformation functions depending upon the type of PSM being inspected.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to techniques that use the design databases used in each of the expose/etch steps during construction of phase shift masks. The techniques can be embodied in software programs implemented on computer hardware. A model or reference image is rendered, accounting for systematic variations, from the design databases to represent what a layer of the PSM should look like after processing. The reference image is compared to an optically acquired image of a specimen PSM to find defects. The technique of the present invention can be used to inspect EAPSM, APSM and tritone masks. Specifically, the inventive technique can be used to inspect full tritone and APSM plates. The technique uses the various design databases used to create a PSM to learn, render images, and combine different edge characteristics to detect defects. The technique inspects all layers in one pass and is therefore more efficient.

Figure 3:
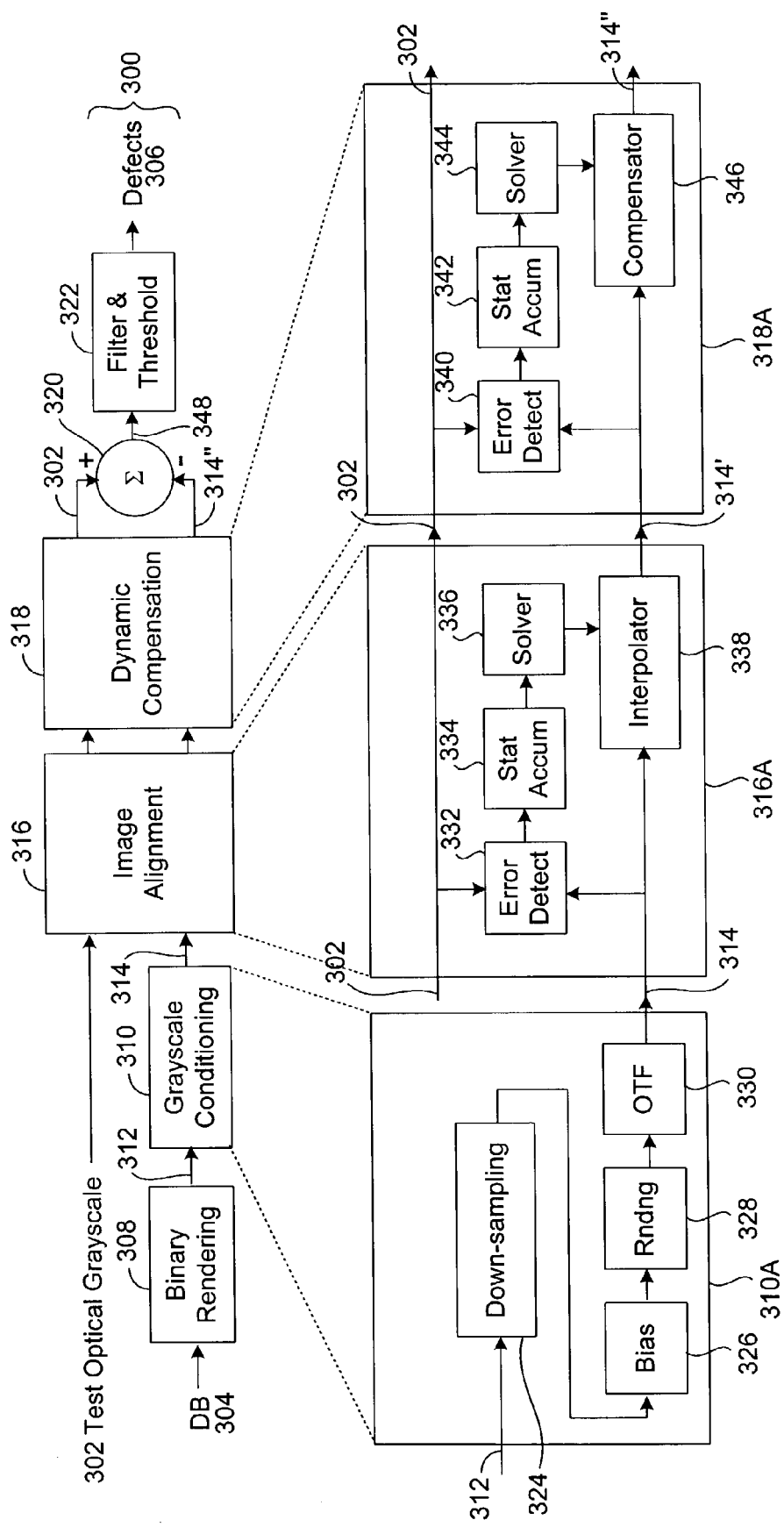
FIG. 3 illustrates a functional block diagram of the processes involved in inspecting a binary photomask.

FIG. 3 illustrates a functional block diagram 300 of the processes involved in inspecting a binary photomask (a photomask having an opaque material layer that lies on top of a quartz substrate). The inspection process of block diagram 300 utilizes two inputs, test optical grayscale 302 and a single database file 304, to generate the output, which is defect information 306. Test optical grayscale 302, hereinafter referred to as "optical image," is an image of the photomask wherein the edges of the pattern within the opaque material layer can be seen on top of the quartz substrate. Optical image 302 is obtained from an optical image capturing system. Database file 304 is the computer file containing information, which describes the pattern of a photoresist layer that is used to etch the pattern into the opaque layer.

An image 312, for example, a bit-map image of the photoresist pattern is generated from database file 304 in Binary Rendering block 308. Grayscale Conditioning block 310 then "conditions," or transforms, the image of the photoresist pattern into a model image 314. Model image 314 is a rendering of what the photomask should look like upon completion of processing. The transformations account for systematic discrepancies between the photoresist mask and the resulting photomask (the opaque layer) that are inherently caused by the writing, developing, and etching processes. In sum, model image 314 accounts for systematic errors, but does not incorporate unanticipated defects.

Optical image 302 and model image 314 are aligned with each other in Image Alignment block 316. Block 316 corrects for dynamic alignment errors. Model image 314 is again adjusted in Dynamic Compensation block 318, wherein compensation is provided to dynamically fine tune the conditioning model. After Dynamic Compensation block 318, optical image 302 and model image 314 are compared to each other in comparing block 320. The signals out of block 320 are filtered in Filter & Threshold block 322. The signals are also compared against threshold values in Filer & Threshold block 322. Differences having values greater than certain thresholds are then determined to be defects in the photomask.

Grayscale Conditioning block 310A is a more detailed illustration of block 310 and is now presented to describe further details of this specific block. Grayscale Conditioning conditions rendered image 312 using a series of transformation functions, which are represented as blocks 324, 326, 328, and 330.

Bias transformation block 326 transforms the rendered image 312 of the photoresist pattern to incorporate biases present in the actual opaque layer that are caused by the etching process. Etching biases refer to the fact that the pattern etched into the opaque material layer will have slightly larger or smaller dimensions than the patterns of the photoresist layer. These dimensional differences are due to inherent characteristics of chemical etching processes.

Rounding transformation block 328 takes the image from Bias transformation block 326 and transforms the image to where the corners where the line patterns bend more accurately represent what corners in the PSM would actually look like after processing. For instance, the corners of the line patterns in the opaque layer will not have the sharp corners as defined in the photoresist mask. Actual etching processes result in corners that are more rounded.

OTF (optical transfer function) block 330 transforms the image received from block 328 to incorporate the optical characteristics of the optical acquisition system used to obtain optical image 302. The output of OTF block 330 is model image 314, which now more realistically represents model image 302. In alternative embodiments of the invention, other transformation blocks to compensate for systematic discrepancies can be included.

Model image 314 serves as a reference image, off of which comparisons can be made to determine defects. Therefore, comparing optical image 302 versus model image 314 facilitates the detection of defects in a photomask. In order to compare the two images, they must be aligned to each other. Such alignment is performed by Image Alignment block 316.

Image Alignment block 316 is shown in more detail by block 316A. Within block 316A, Error Detect block 332, Statistical Accumulator block 334, Solver block 336, and Interpolator block 338 function to align model image 314 with optical image 302. Error Detect block 332 receives both images as input and then proceeds to compare the alignment error between the images for each discrete region of the images. For example, misalignment can be detected for each feature (e.g., IC feature) created in the patterns. Then the Statistical Accumulator block 334 accumulates all of the individual misalignment errors and determines the overall misalignment error between the optical image and the model image. The overall misalignment error is the average of all the individual feature errors over a specific window size.

The window size should be large enough to get a good average and small enough to track out any dynamic acquisition errors such as microscope vibration.

Solver block 336 uses the accumulated misalignment error information to determine the adjustments that are required to put model image 314 into the optimal alignment with optical image 302. Interpolator block 338 uses the adjustment information from Solver block 336 to resample model image 314 onto a sample grid that is well aligned to the sampling grid of optical image 302. Image alignment block 316 (or 316A) then outputs optical image 302 and the re-sampled model image 314' to the Dynamic Compensation block 318.

Block 318A is presented to describe Dynamic Compensation block 318 in more detail. Dynamic Compensation block 318 dynamically fine tunes the conditioning model so as to locally minimize the systematic errors between shifted model image 314' and optical image 302. Due to acceptable process variations across the plate being inspected or due to small drifts in the performance of the image acquisition system, dynamic fine adjustments to the conditioning model may be needed in order to achieve the best possible inspection results. After identifying which components of the conditioning model are to be dynamically tracked, compensation blocks can be designed for each. Each dynamic Compensation block 318A has an Error Detect block 340, a Statistical Accumulator block 342, a Solver block 344, and a Compensator block 346. For each Dynamic Compensation block, the Error Detect block 340 determines the drift in the component being tracked by locally comparing the conditioned and optical images. Statistical Accumulator block 342 accumulates the local drift terms over a suitably sized window. The window size is set to get good averaging of the error terms, to get good tracking of the error trend while not tracking out real defects. Solver block 344 uses the accumulated error information to determine the adjustments required to compensate for the errors. Compensator block 346 uses the adjustment information from Solver block 344 to compensate for the errors. The compensated and shifted model image 314" is outputted, along with the optical image 302, to be compared in the Summation block 320.

Summation block 320 compares and takes the difference between optical image 302 and image 314". For instance, the differences between the two images are determined for each discrete region of the PSM images. The differential values 348 are transmitted to the Filter & Threshold block 322. Filter & Threshold block 322 filters the differential values to obtain high signal to noise ratios. Block 322 then uses threshold values to determine which differential values are deemed to be defects in a photomask. Defect information 306 is the output of the inspection process 300.

Figure 4:
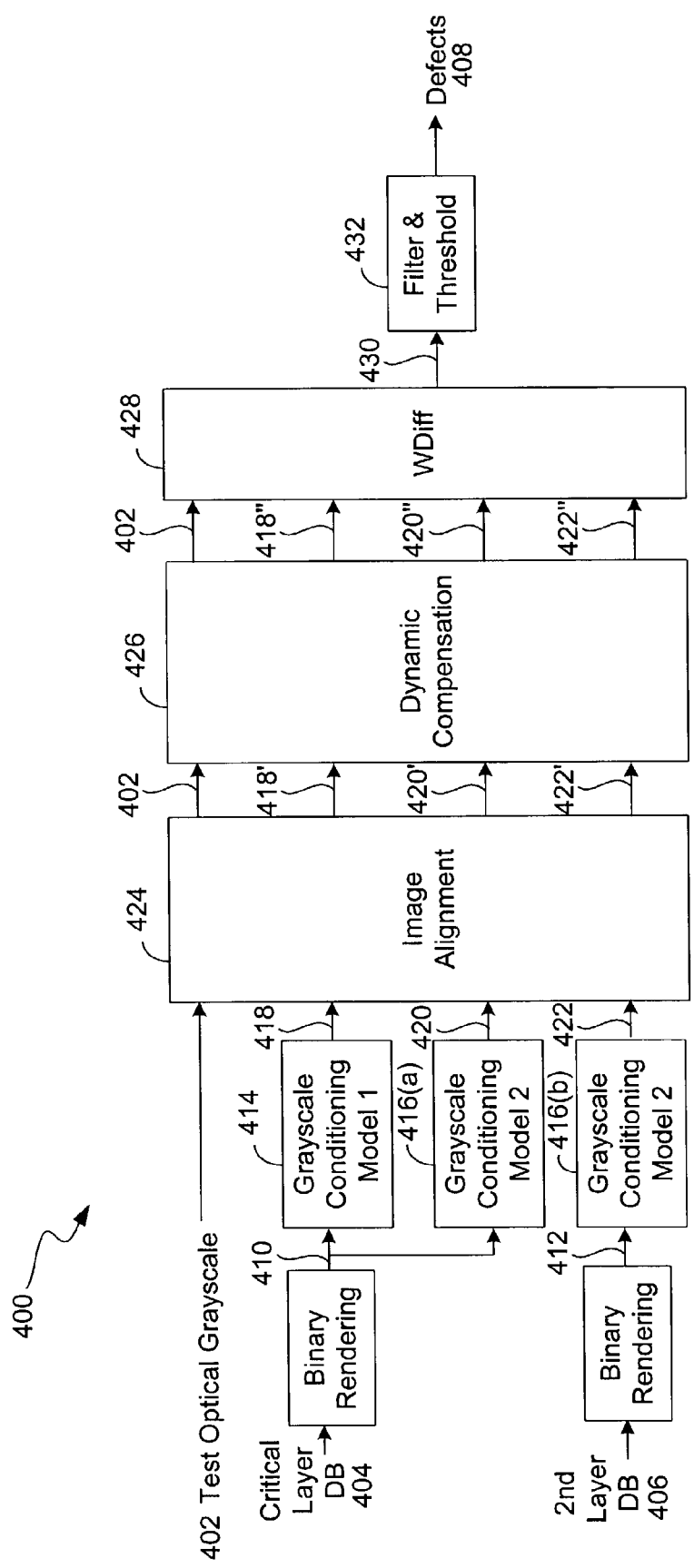
FIG. 4 illustrates a flow diagram describing the process for inspecting an alternating phase shift mask (APSM) according to one embodiment of the invention.

FIG. 4 illustrates a flow diagram describing the process 400 for inspecting an alternating phase shift mask (APSM) according to one embodiment of the invention. The inspection process 400 utilizes three input data files to generate defect output information 408. The input data files include a test optical grayscale file 402, a critical layer database file 404, and a second layer database file 406. Test optical grayscale file 402 (hereinafter "optical image") is an optical image taken of the APSM being inspected. Critical layer database file 404 is a database file describing the pattern within the photoresist mask used to form the apertures within the opaque material layer of the APSM. Second layer database file 406 is a database file describing the pattern within the photoresist mask used to selectively etch wells (typically, 180-degree wells) into the quartz layer of the APSM. Defect output information 408 provides information regarding defects within the APSM such as, but not limited to, misaligned apertures within the opaque layer and incorrectly formed zero or 180-degree wells.

Images 410 and 412 of each patterned photoresist layer are rendered from critical layer database file 404 and from second layer database file 406, respectively. Images 410 and 412 are conditioned by Grayscale Conditioning blocks 414, 416(a) and 416(b) to generate model images 418, 420, and 422. Image Alignment block 424 aligns optical image 402 and model images 418, 420, and 422 and produces Aligned model images 418', 420' and 422'. Dynamic Compensation block 426 then receives aligned model images 418', 420' and 422' and then compensates these images for dynamic systematic errors. The output of Dynamic Compensation block 426 are optical image 402, and processed model images 418", 420" and 422", which are operated upon by Weighted Differencer block 428. The Weighted Differencer block first takes difference between the optical image 402 and each of the aligned, conditioned and compensated critical layer images, 418" and 420". These two differences are then weighted and summed to produce the weighted difference output, 430. The weight applied to each difference is dynamically determined by the Weight Function, 474, that operates on the aligned and conditioned second layer image 422 and possibly on one of the aligned, conditioned and compensated critical layer images, shown here as 422'. Filter & Threshold block 432 finally identifies the defects within the inspected APSM specimen.

When inspecting APSM, as described in FIG. 4, critical layer database file 404 describes the location of the apertures in the opaque layer of APSM. Grayscale Condition Model 1, block 414, conditions image 410 such that the image of the photoresist mask 410 is transformed into a model image 418 of APSM having zero-degree wells. The grayscale conditioning transformation functions are similar to those described in block 310A of FIG. 3. Grayscale Conditioning Model 2, block 416(a), conditions image 410 to produce a model image 420 of APSM having 180-degree wells. Depending upon specific etching processes used to create the apertures and wells in APSM's, the resulting apertures can be sized either larger or smaller than the respective patterns in the photoresist layer. Grayscale Conditioning blocks 414 and 416(a) are used to simulate these systematic discrepancies between the patterned photoresist layers and the APSM apertures.

Image 412 of the photoresist layer, which is used to create the 180-degree wells, is used by inspection process 400 to determine when to use either model image 418 or model image 420 during the defect analysis process. Image 412 is conditioned by block 416(b) such that openings in the photoresist layer are conditioned to the same extent that image 410 is conditioned by block 416(a). For example, Grayscale Condition block 416(b) causes the apertures in model image 422 to either grow or shrink to the same extent that the apertures in model image 420 grow or shrink. In this manner, inspection process 400 can more accurately switch between using model image 418 or model image 420 during the inspection process. Grayscale Conditioning block 416(b) prevents errors such as using a model image containing zero-degree wells when, in actuality, process 400 is in the process of inspecting a 180-degree well. Note that blocks 416(a) and 416(b) contain the same transformation functions used for conditioning purposes.

Figure 5:
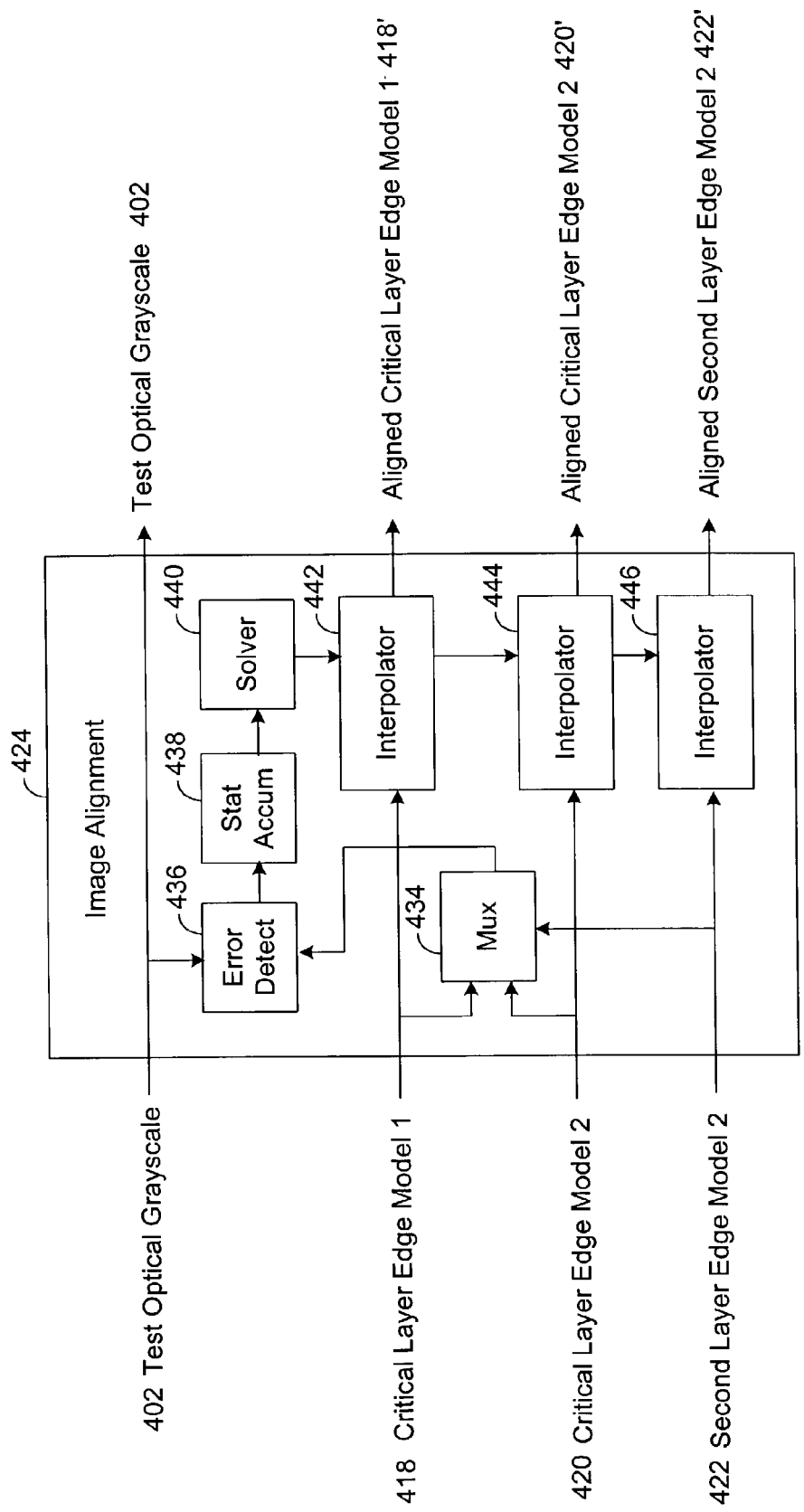
FIG. 5 illustrates the sub-processes of the Image Alignment block of FIG. 4 according to one embodiment of the present invention.

FIG. 5 illustrates the sub-processes of Image Alignment block 424 according to one embodiment of the present invention. Image Alignment block 424 adjusts model images 418, 420 and 422 such that they become aligned with themselves and with optical image 402. Model images 418 and 420 and model image 422 are transmitted into multiplexer 434. Mutliplexer 434 determines which model image, either 418 or 420, to compare with optical image 402. Multiplexer 434 makes this determination by checking model image 422 to determine which kind of well is currently being inspected. After checking model image 422, multiplexer 434 is able to select one of model images 418 or 420 to use for error detection. For example, model image 418 is transmitted by multiplexer 434 to Error Detect block 436 when a region of optical image 402 containing a zero-degree well is inspected. On the other hand, model image 420 is transmitted by multiplexer 434 to Error Detect block 436 when a region of optical image 402 containing a 180-degree well is inspected.

Error Detect block 436 detects the alignment errors between either model image 418 or 420 and optical image 402 for each feature of the optical image 402 depending upon the region being inspected. Error detection is performed for the entire region of an optical image so that alignment errors for each feature within optical image 402 are determined. In alternative embodiments, error detection is determined for a region smaller than the entire optical image 402.

Statistical Accumulator block 438 receives each of the alignment error readings from block 436 and then accumulates all of the individual misalignment errors to determine the overall misalignment error between optical image 402 and each of the model images 418 and 420, respectively. The overall misalignment error for each model image 418 and 420 is the average of all the individual feature errors over a specific window size.

Solver block 440 uses the overall alignment error determined by Statistical Accumulator block 438 to determine the adjustments that are required to put each of the model images 418, 420 and 422 into optimal alignment with optical image 402. Each of the Interpolator blocks 442, 444, and 446 then utilize adjustment information from Solver block 440 to shift each respective model image into better alignment with optical image 402. Interpolator block 442 outputs aligned image 418', Interpolator block 444 outputs aligned image 420', and Interpolator block 442 outputs aligned image 422'. Each of aligned images 418', 420' and 422' are aligned with optical image 402.

Figure 6:
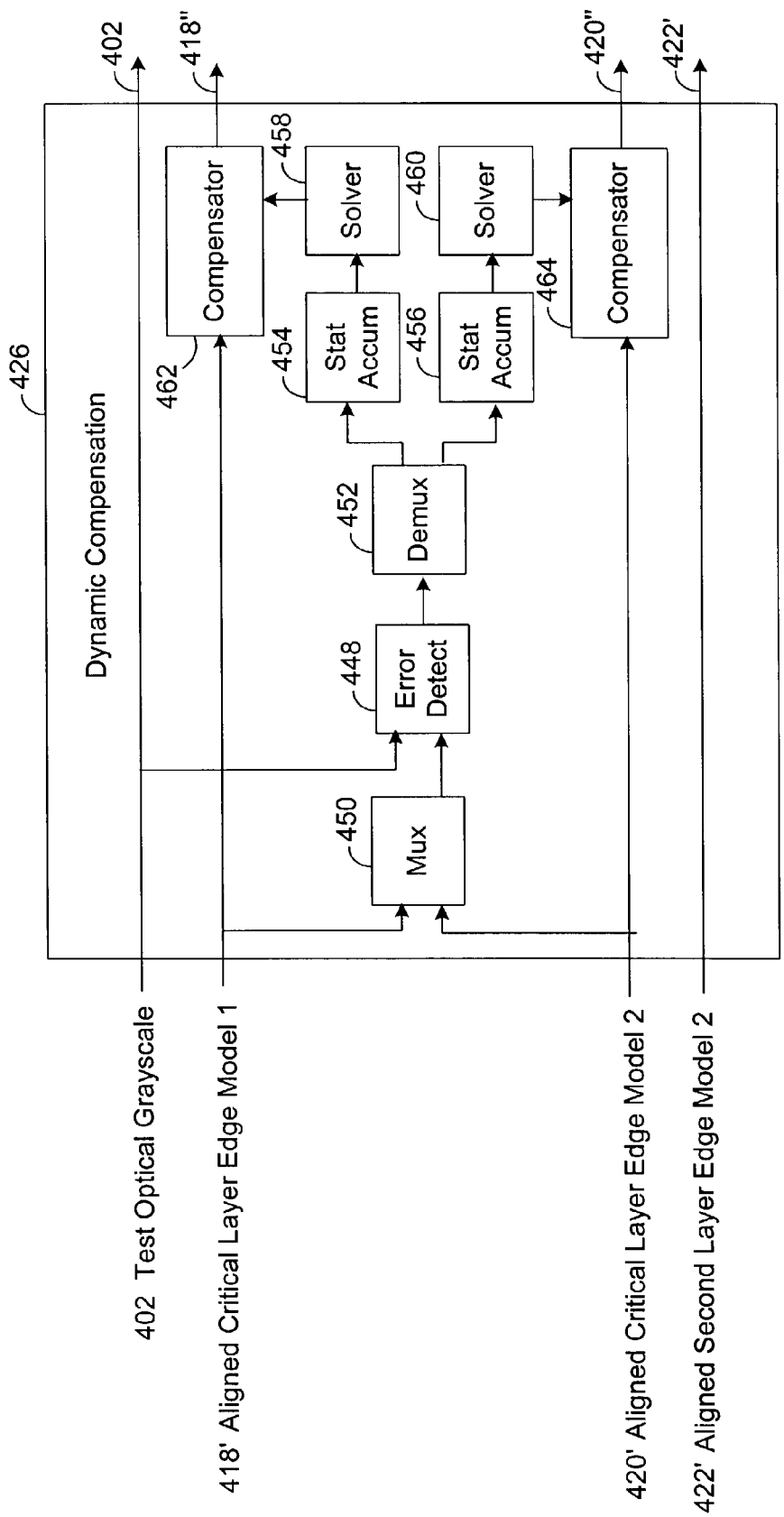
FIG. 6 illustrates the sub-processes of Dynamic Compensation block of FIG. 4 according to one embodiment of the present invention.

FIG. 6 illustrates the sub-processes of Dynamic Compensation block 426 according to one embodiment of the present invention. Dynamic Compensation block 426 detects then compensates for dynamic errors in each of aligned model images 418' and 420'. The dynamic errors for each feature within each of the aligned model images 418' and 420' are detected in Error Detection block 448. As in Image Alignment block 424, a multiplexer 450 selects which aligned model image (418' or 420') to transmit into Error Detect block 448 depending upon the region of optical image 402 being inspected and by checking against model image 422'. Specifically, this depends upon which type of well is being inspected. The dynamic errors are transmitted from block 448 to a de-multiplexer 452 such that dynamic errors for each respective aligned model image are sent to a respective series of Statistical Accumulators 454 and 456, Solvers 458 and 460, and Compensators 462 and 464. Statistical Accumulators 454 and 456 accumulate the individual errors and determine the overall dynamic error between the respective aligned images 418' and 420' and the optical image 402. Solver blocks 458 and 460 uses the respective accumulated error information to determine the adjustments required to compensate for the errors in each aligned model image. Compensator blocks 462 and 464 uses the adjustment information from Solver blocks 458 and 460 to compensate for the errors. The compensated and aligned model images 418" and 420" are generated and then transmitted to Weighted Differencer block 428. Images 418" and 420" are referred to hereinafter as the processed images 418" and 420".

Figure 7:
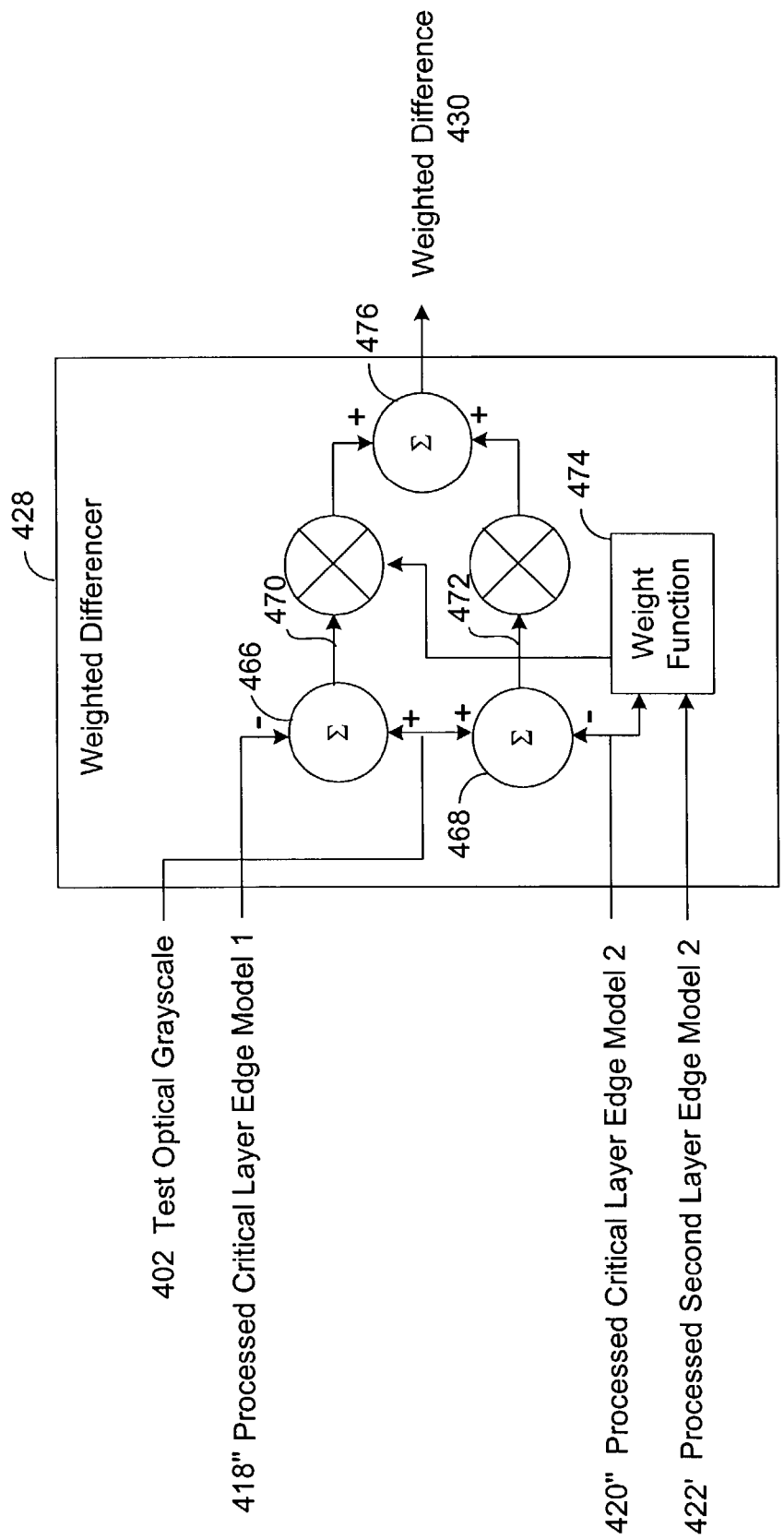
FIG. 7 illustrates the sub-processes of Weight Differencer block of FIG. 4 according to one embodiment of the present invention.

FIG. 7 illustrates the sub-processes of Weighted Differencer block 428 according to one embodiment of the present invention. Summation blocks 466 and 468 each take the difference between optical image 402 and processed images 418" and 420", respectively. Summation block 466 generates the differential value 470, which is the difference or error between optical image 402 and processed image 418". Summation block 468 generates the differential value 472, which is the difference or error between optical image 402 and processed image 420". Weight Function block 474 uses the inputs of processed image 420" and aligned image 422' to determine the weight given to each differential value 470 or 472 depending upon the specific region of optical image 402 being inspected. For instance, when inspecting a region of optical image 402 containing a 180-degree well, a weight of one is given to differential value 472 and a weight of zero is given to value 470. Then summation block 476 adds the two differential values for the weighted differential value 430. On the other hand, when inspecting a region containing a zero-degree well, a weight of one is given to differential value 470 and a weight of zero is given to value 472. However, when a region that is close in proximity to both a zero degree well and a 180-degree well, the weights are balanced between the two differential values 470 and 472 depending upon the relative proximity to each type of well. For APSM masks with exposed 0-degree to 180-degree transitions, the sum of the weights can be dropped to zero so as to ignore phase edges that will be cut out by a second "cut mask" masking operation during wafer exposure. The processes of Weighted Differencer block 428 can be iteratively performed for discrete regions of the APSM being inspected.

The weighted differential values 430 are transmitted to the Filter & Threshold block 432. Filter & Threshold block 432 filters the differential values to obtain higher signal-to-noise ratios. Block 432 then uses threshold values to determine which differential values are deemed to be defects in the APSM. Defect information 408 is the output of the inspection process 400.

Figure 1A:
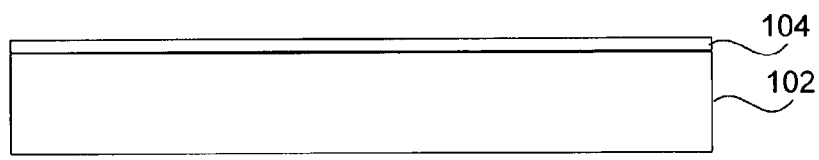
FIGS. 1A–1E illustrate a layered substrate as it passes through progressive stages of fabrication to form an alternating phase shift mask (APSM).
Figure 1B:
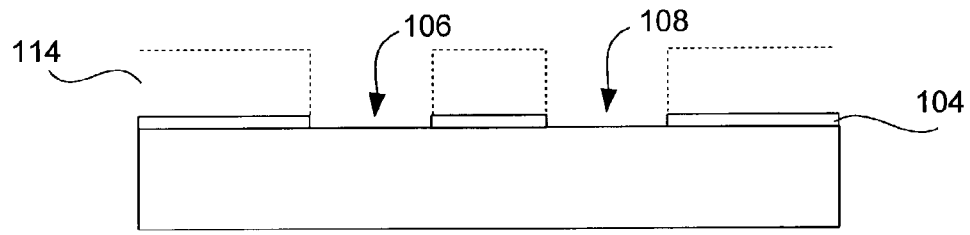
Figure 1C:
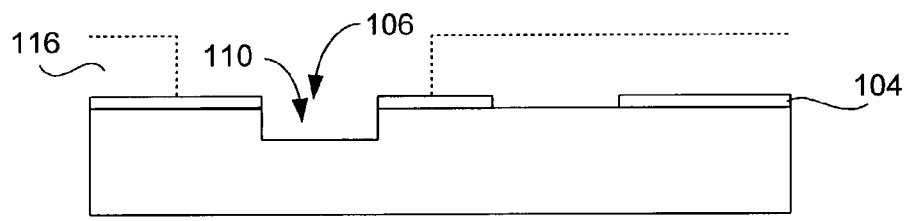
Figure 1D:
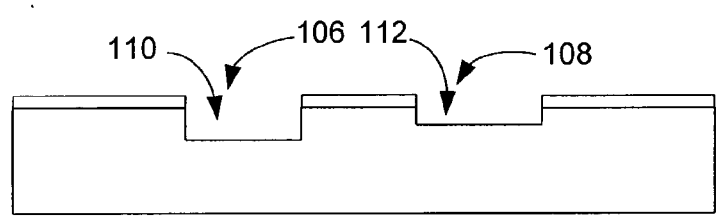
Figure 1E:
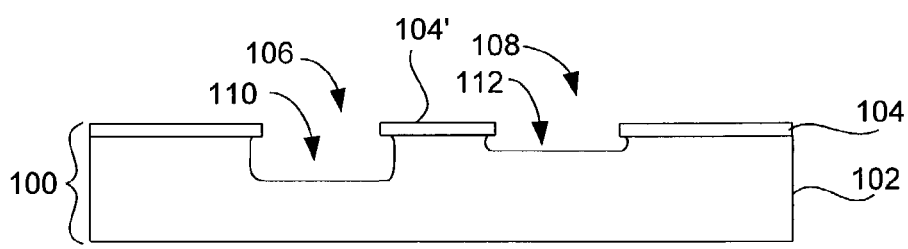
Figure 2A:
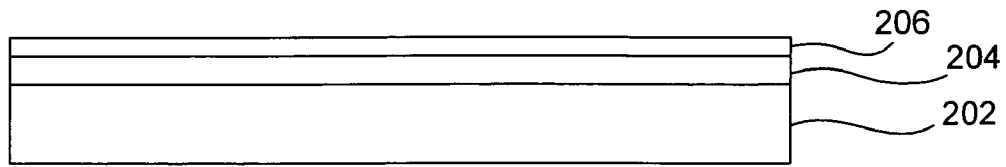
FIGS. 2A–2D illustrate a layered substrate as it passes through progressive stages of fabrication to form a tritone mask.
Figure 2B:
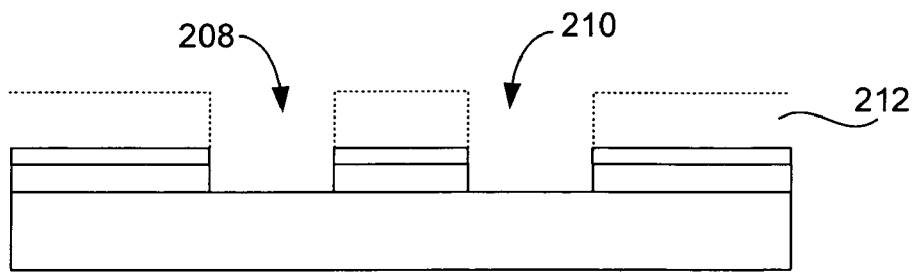
Figure 2C:
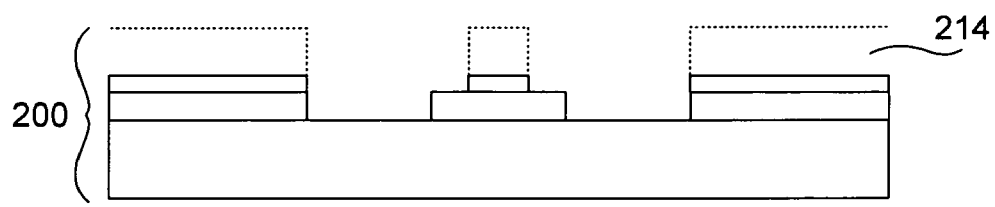
Figure 2D:
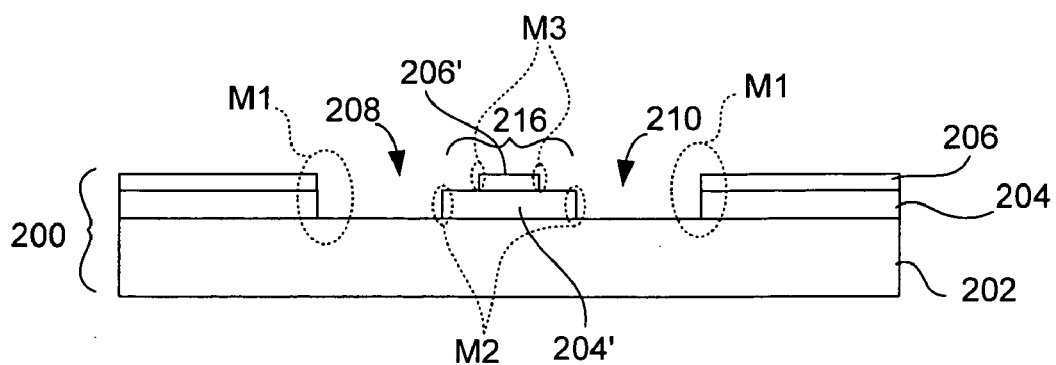
Figure 8:
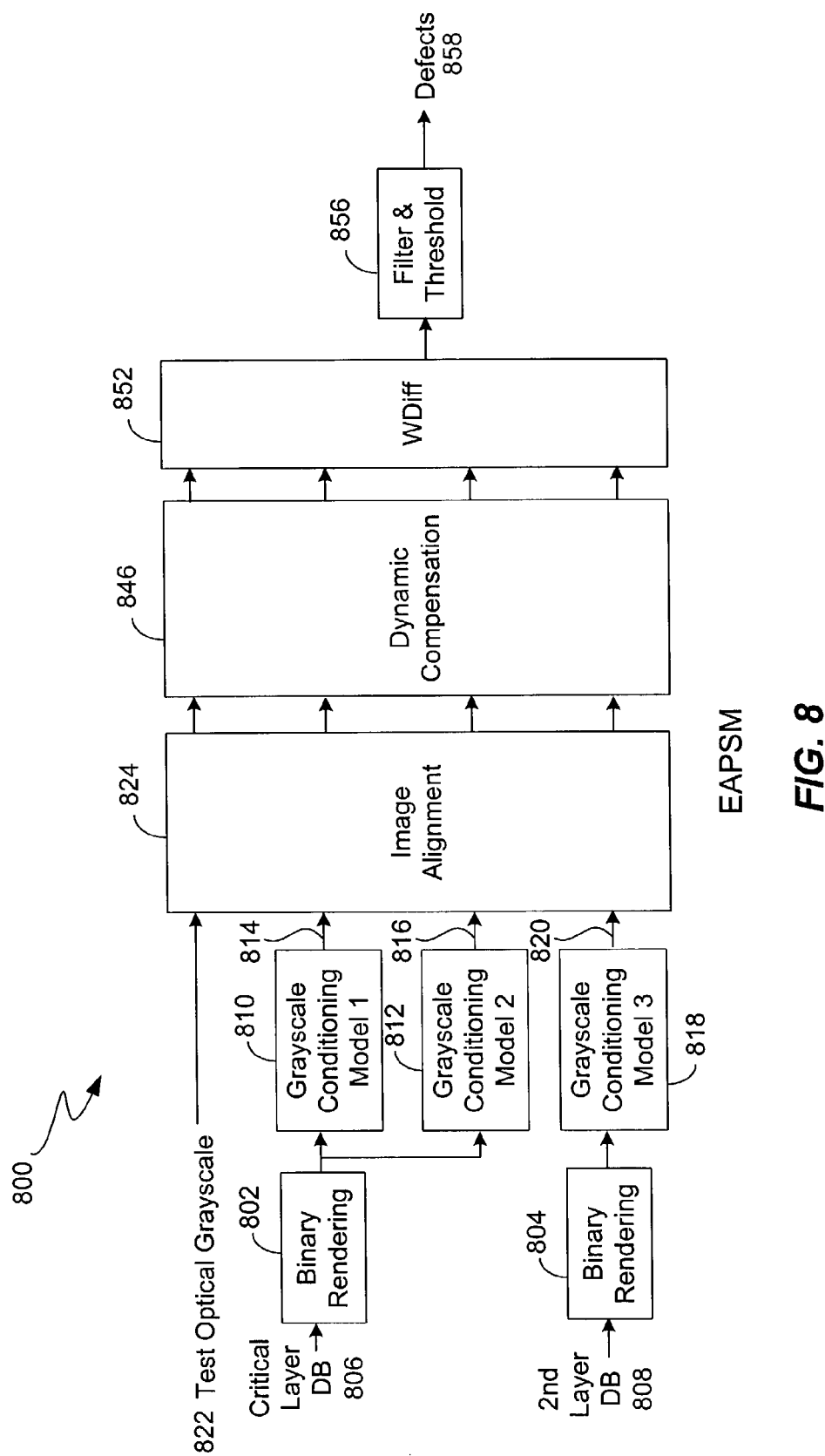
FIG. 8 describes a process for inspecting an embedded attenuating phase shift mask (EAPSM) according to one embodiment of the present invention.

FIG. 8 describes a process 800 for inspecting a tritone mask according to one embodiment of the present invention. FIG. 8 will be described with reference to the tritone 200 of FIGS. 2A–2D. Generally, process 800 involves modeling three types of edges to create model images, and then comparing the model images to an actual optical image. The three types of edges include the edge of opaque layer 206 over attenuator layer 204, the edge of attenuator layer 204 over quartz layer 202, and the edge of opaque layer 206 over quartz layer 202. See FIG. 2D.

Process 800 begins with Binary Rendering blocks 802 and 804 rendering bit map images of critical layer database file 806 and second layer database file 808, respectively. The image rendered by block 802 is simultaneously conditioned by Grayscale Conditioning Model 1 block 810 and Grayscale Conditioning Model 2 block 812. Model 1 block 810 generates a model image 814 of tritone having openings corresponding to critical layer database file 212 (of FIG. 2B) with edges M1 conditioned to take on characteristics typical of etching processes. Edges M1 are the aligned opaque and attenuator edges opposite the island 216 of opaque 204' and attenuator 206' material. Model 2 block 812 generates a model image 816 of tritone having openings corresponding to critical layer database file 212 with edges M2 conditioned to take on characteristics typical of etching processes. Edges M2 are the attenuator edges of island 216. The image rendered by block 804 is conditioned by Grayscale Conditioning Modeling 3 block 818 to generate a model image 820 of tritone having openings corresponding to second layer database file 808 (corresponding to photoresist layer 214 of FIG. 2C) with edges M3. Edges M3 are the edges of opaque layer of island 216.

Figure 9:
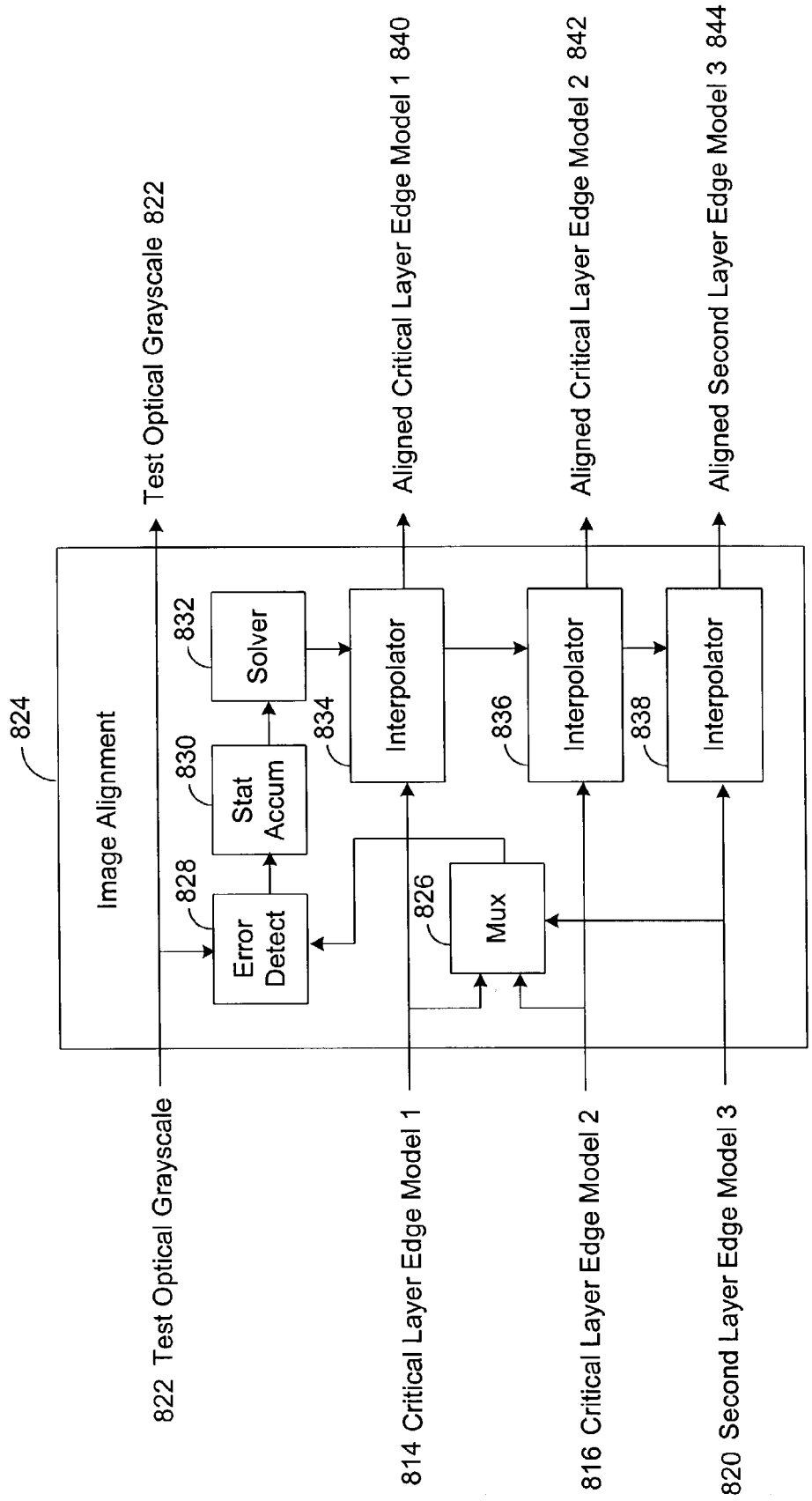
FIG. 9 illustrates the sub-processes of Image Alignment block of FIG. 8 according to one embodiment of the invention.

The model images 814, 816 and 820, along with the actual optical image 822 are received by the Image Alignment block 824, which function to align the images with each other. FIG. 9 illustrates Image Alignment block 824 of FIG. 8 in greater detail. Model image 820 is used by Multiplexer block 826 to select which of model image 814 or model image 816 to transmit to Error Detect block 828. Multiplexer block 826 selects model image 814 when it does not detect a quartz edge extending beyond the edge of an opening of model image 820. In other words, if a quartz edge is not detected to extend beyond an edge of an opening of the second layer database 214, then the edge is determined to be an M1 edge. On the other hand, model image 816 is selected when an edge M2 is detected within an opening of model image 820. In other words, if a quartz edge is detected to extend into an opening of the second layer database 214, then the edge is determined to be an M2 edge.

The Error Detect block 828, a Statistical Accumulator block 830, a Solver block 832, and three Interpolator blocks 834, 836 and 838 function in a similar manner as described for the inspection process 400. Interpolator blocks 834, 836 and 838 generate aligned model images 840, 842 and 844, respectively.

Figure 10:
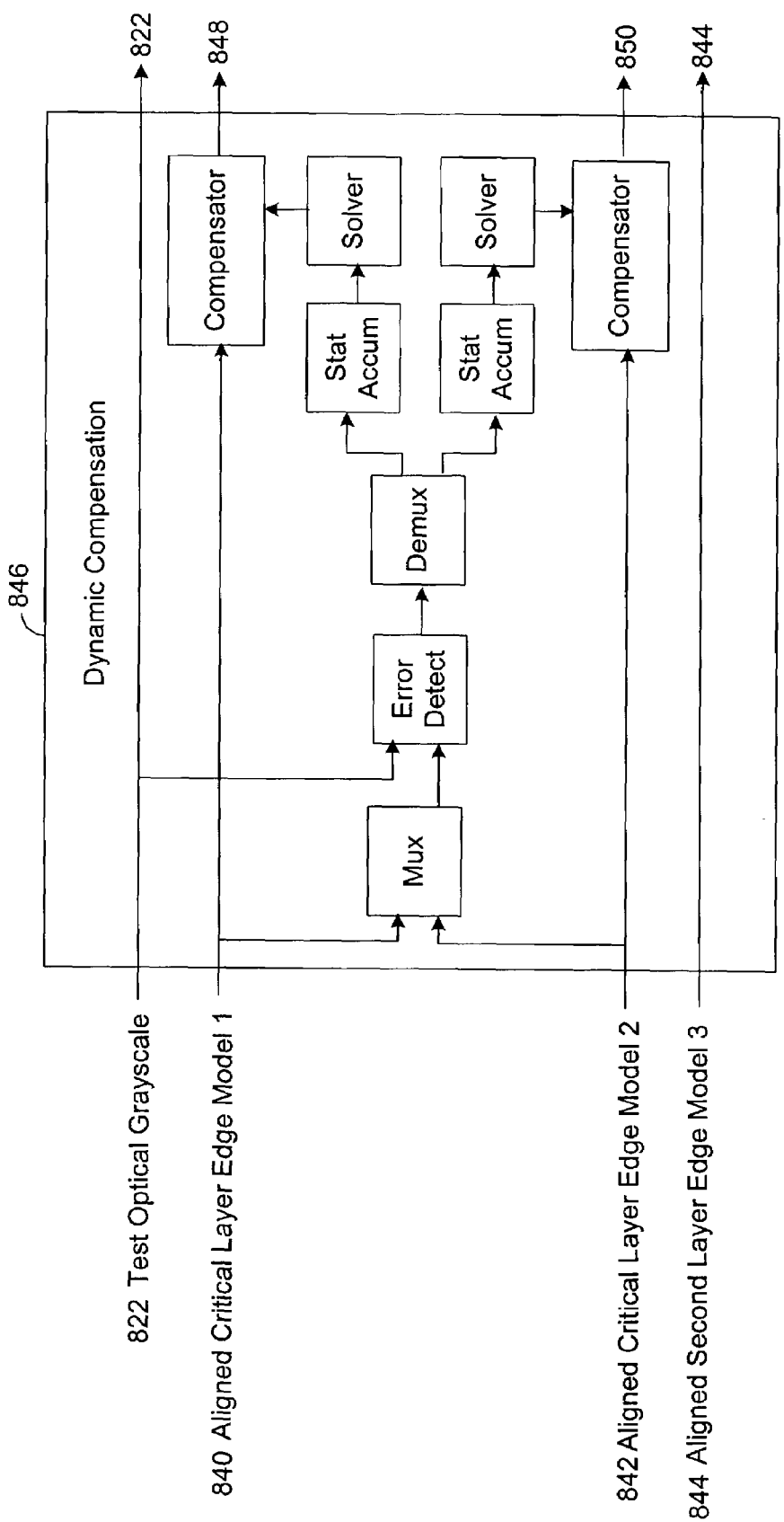
FIG. 10 illustrates Dynamic Compensation block of FIG. 8 in detail to show its sub-processes, according to one embodiment of the invention.

Aligned model images 840, 842, and 844, and optical image 822 are transmitted to a Dynamic Compensation block 846. FIG. 10 illustrates Dynamic Compensation block 846 in detail to show its sub-processes, according to one embodiment of the invention. Dynamic Compensation block 846 has sub-processes that function in a similar manner to those of Dynamic Compensation block 426 of FIG. 4. Block 846 also achieves the similar goals of block 426 in that dynamic systematic errors of aligned model images 840 and 842 are compensated for. Dynamic Compensator block 846 generates processed model images 848 and 850, that are then sent to a Weight Difference block 852.

Figure 11:
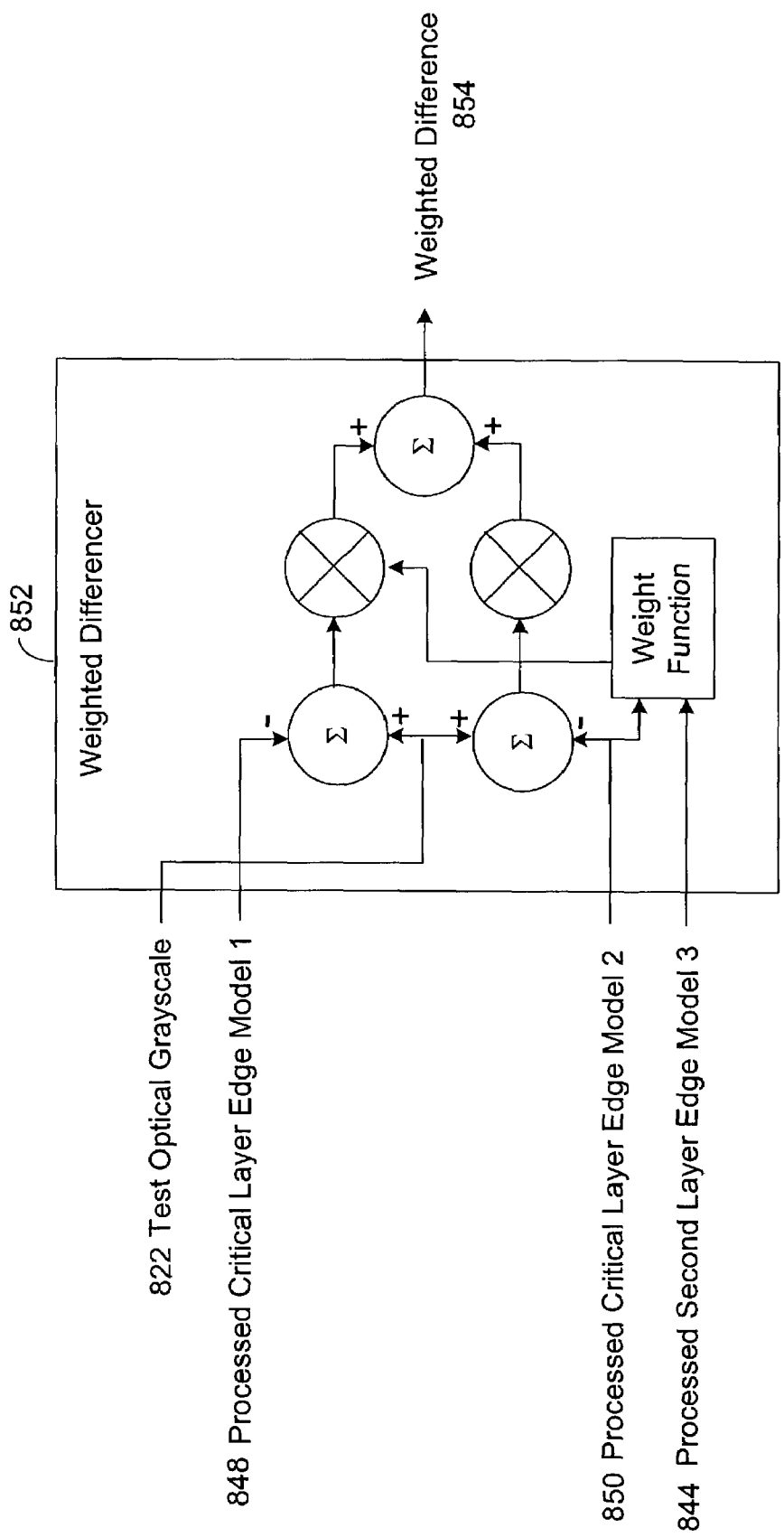
FIG. 11 illustrates Weight Differencer block of FIG. 8 in detail to show its sub-processes, according to one embodiment of the invention.

Weighted Differencer block 852, as illustrated in FIG. 11, also functions in a similar manner as Weighted Differencer block 428 of FIG. 4 to generate weighted difference output results 854. For tritone masks the sum of the weights may be set to less than unity so as to desensitize defect detection on chrome to attenuator transitions. The Weighted differences 854 are sent through a filtering and threshold test in Filter & Threshold block 856 to determine the defects 858 in the tritone mask.

The processes of this invention can be commonly be programmed in a variety of software languages including languages such as C and C++.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A method for inspecting an advanced phase shift mask comprising:
   receiving a first database file and rendering a first image of a first photoresist layer;
   conditioning the first image according to a first set of transformation functions to generate a first critical layer model image;
   conditioning the first image according to a second set of transformation functions to generate a second critical layer model image;
   receiving a second database file and rendering a second image of a second photoresist layer;
   aligning the first critical layer model image, the second critical layer model image, and the second image with an optical image of the advanced phase shift mask;
   determining a first differential value between the first critical layer model image and the optical image;
   determining a second differential value between the second critical layer model image and the optical image;
   according a respective weight to the first and second differential values, and generating a weighted differential value; and
   comparing the weighted differential value against a threshold value to determine if a defect exists.

2. A method as recited in claim 1 further comprising:
   conditioning the second image of the second photoresist layer according to the second set of transformation functions.

3. A method as recited in claim 1 further comprising:
   conditioning the second image of the second photoresist layer according to a third set of transformation functions.

4. A method as recited in claim 1 wherein the aligning operation further comprises:
   selecting either the first or second critical layer model image based upon the second image to use for alignment error detection;
   detecting an alignment error between the selected critical layer model image and the optical image; and
   adjusting the selected critical layer model image such that it becomes aligned with the optical image.

5. A method as recited in claim 1 further comprising:
   compensating the first and second critical layer model images to dynamically remove systematic errors within each respective image, the compensating operation being performed before the first and second differential values are determined.

6. A method as recited in claim 5 wherein compensating operation further comprises:
   selecting either the first or second critical layer model image based upon the second image to use for dynamic systematic error detection;
   detecting systematic errors between either the first or second critical layer model image and the optical image;
   demultiplexing the systematic errors for each of the first and second critical layer model images; and
   adjusting the first and second critical layer model images such that the systematic errors are removed from each of the respective model images.

7. A method as recited in claim 1 wherein the first set of transformation functions further comprises:
   a bias transformation function configured to incorporate characteristics into the first image that are typical of an advanced phase shift mask that has undergone an etching process.

8. A method as recited in claim 1 wherein the first set of transformation functions further comprises:
a rounding transformation function configured to transform the corners of patterns within the first image to more accurately represent the corners of patterns within the advanced phase shift mask.

9. A method as recited in claim 1 wherein the first set of transformation functions further comprises:
an optical transfer function configured to incorporate characteristics into the first image that are associated with an image acquisition system used to obtain the optical image of the advanced phase shift mask.

10. A method as recited in claim 1 wherein the second set of transformation functions further comprises:
a bias transformation function configured to incorporate characteristics into the first image that are typical of an advanced phase shift mask that has undergone an etching process.

11. A method as recited in claim 1 wherein the second set of transformation functions further comprises:
a rounding transformation function configured to transform the corners of patterns within the first image to more accurately represent the corners of patterns within the advanced phase shift mask.

12. A method as recited in claim 1 wherein the second set of transformation functions further comprises:
an optical transfer function configured to incorporate characteristics into the first image that are associated with an image acquisition system used to obtain the optical image of the advanced phase shift mask.

13. A system for inspecting an advanced phase shift mask comprising:
a first binary rendering module configured to receive a first database file and rendering a first image of a first photoresist layer;
a first conditioning module configured to condition the first image according to a first set of transformation functions to generate a first critical layer model image;
a second conditioning module configured to condition the first image according to a second set of transformation functions to generate a second critical layer model image;
a second binary rendering module configured to receive a second database file and rendering a second image of a second photoresist layer;
an image alignment module configured to align the first critical layer model image, the second critical layer model image, and the second image with an optical image of the advanced phase shift mask;
a weight differencing module configured to perform the following operations:
determine a first differential value between the first critical layer model image and the optical image,
determine a second differential value between the second critical layer model image and the optical image, and
accord a respective weight to the first and second differential values, and generate a weighted differential value; and
a threshold module configured to compare the weighted value against a threshold value to determine if a defect exists.

14. A system as recited in claim 13 further comprising:
an additional second conditioning module configured to condition the second image of the second photoresist layer according to the second set of transformation functions.

15. A system as recited in claim 13 further comprising:
a third conditioning module configured to condition the second image of the second photoresist layer according to a third set of transformation functions.

16. A system as recited in claim 13 wherein the image alignment module is further configured to:
select either the first or second critical layer model image based upon the second image to use for alignment error detection;
detect an alignment error between selected critical layer model image and the optical image; and
adjust the selected critical layer model image such that it becomes aligned with the optical image.

17. A system as recited in claim 13 wherein the first set of transformation functions further comprises:
a bias transformation function configured to incorporate characteristics into the first image that are typical of an advanced phase shift mask that has undergone an etching process.

18. A system as recited in claim 13 wherein the first set of transformation functions further comprises:
a rounding transformation function configured to transform the corners of patterns within the first image to more accurately represent the corners of patterns within the advanced phase shift mask.

19. A system as recited in claim 13 wherein the first set of transformation functions further comprises:
an optical transfer function configured to incorporate characteristics into the first image that are associated with an image acquisition system used to obtain the optical image of the advanced phase shift mask.

20. A system as recited in claim 13 wherein the second set of transformation functions further comprises:
a bias transformation function configured to incorporate characteristics into the first image that are typical of an advanced phase shift mask that has undergone an etching process.

21. A system as recited in claim 13 wherein the second set of transformation functions further comprises:
a rounding transformation function configured to transform the corners of patterns within the first image to more accurately represent the corners of patterns within the advanced phase shift mask.

22. A system as recited in claim 13 wherein the second set of transformation functions further comprises:
an optical transfer function configured to incorporate characteristics into the first image that are associated with an image acquisition system used to obtain the optical image of the advanced phase shift mask.

23. A method for inspecting an alternating phase shift mask (APSM) comprising:
receiving a first database file and rendering a first image of a first photoresist layer;
conditioning the first image according to a first set of transformation functions to generate a first model image representing a phase shift mask having a plurality of first openings;
conditioning the first image according to a second set of transformation functions to generate a second model image representing a phase shift mask having a plurality of second openings;
receiving a second database file and rendering a second image of a second photoresist layer;
conditioning the second image according to the second set of transformation functions to generate a third model image;

aligning the first model image, the second model image, and the third model image with an optical image of the APSM;
determining a first differential value between the first model image and the optical image;
determining a second differential value between the second model image and the optical image;
according a respective weight to the first and second differential values, and generating a weighted differential value; and
comparing the weighted value against a threshold value to determine if a defect exists.

24. A method as recited in claim 23 wherein the operations of determining the first and second differential values, according respective weights and comparing are repeated for a plurality of sub-sections of the optical image.

25. A method as recited in claim 23 wherein the aligning operation further comprises:
detecting a first differential error between the first model image and the optical image when inspecting a region of the optical image containing a first well;
detecting a second differential error between the second model image and the optical image when inspecting a region of the optical image containing a second well;
adjusting the first model image so that it becomes aligned with the optical image; and
adjusting the second model image so that becomes aligned with the optical image.

26. A method as recited in claim 23 further comprising compensating the first and second model images to dynamically remove systematic errors within each respective image, the compensating operation further comprising:
detecting a first systematic error between the first model image and the optical image when inspecting a region of the optical image containing a first well;
detecting a second systematic error between the second model image and the optical image when inspecting a region of the optical image containing a second well;
adjusting the first model image to compensate for the first systematic error; and
adjusting the second model image to compensate for the second systematic error.

27. A method as recited in claim 23 wherein the first set of transformation functions further comprises:
a bias transformation function configured to incorporate characteristics into the first image that are typical of a phase shift mask that has undergone an etching process.

28. A method as recited in claim 23 wherein the first set of transformation functions further comprises:
a rounding transformation function configured to transform the corners of patterns within the first image to more accurately represent the corners of patterns within the phase shift mask.

29. A method as recited in claim 23 wherein the first set of transformation functions further comprises:
an optical transfer function configured to incorporate characteristics into the first image that are associated with an image acquisition system used to obtain the optical image of the phase shift mask.

30. A method as recited in claim 23 wherein the second set of transformation functions further comprises:
a bias transformation function configured to incorporate characteristics into each of the first and second images that are typical of a phase shift mask that has undergone an etching process.

31. A method as recited in claim 23 wherein the second set of transformation functions further comprises:

a rounding transformation function configured to transform the corners of patterns within each of the first and second images to more accurately represent the corners of patterns within the phase shift mask.

32. A method as recited in claim 23 wherein the second set of transformation functions further comprises:
an optical transfer function configured to incorporate characteristics into each of the first and second images that are associated with an image acquisition system used to obtain the optical image of the phase shift mask.

33. A method for inspecting a tritone mask comprising:
receiving a first database file and rendering a first image of a first photoresist layer;
conditioning the first image according to a first set of transformation functions to generate a first model image representing the tritone mask having a plurality of first edges, the first edges being the aligned edges of an opaque material and an attenuating material;
conditioning the first image according to a second set of transformation functions to generate a second model image representing the tritone mask having a plurality of second edges, each of the second edges being an edge of an island of attenuating material;
receiving a second database file and rendering a second image of a second photoresist layer;
conditioning the second image according to a third set of transformation functions to generate a third model image;
aligning the first model image, the second model image, and the third model image with an optical image of the tritone mask;
determining a first differential value between the first model image and the optical image;
determining a second differential value between the second model image and the optical image;
according a respective weight to the first and second differential values, and generating a weighted differential value; and
comparing the weighted value against a threshold value to determine if a defect exists.

34. A method as recited in claim 33 wherein the operations of determining the first and second differential values, according respective weights and comparing are repeated for a plurality of sub-sections of the optical image.

35. A method as recited in claim 33 wherein the aligning operation further comprises:
detecting a first differential error between the first model image and the optical image when inspecting a region of the optical image containing a first edge;
detecting a second differential error between the second model image and the optical image when inspecting a region of the optical image containing a second edge;
adjusting the first model image so that it becomes aligned with the optical image; and
adjusting the second model image so that becomes aligned with the optical image.

36. A method as recited in claim 33 further comprising compensating the first and second model images to dynamically remove systematic errors within each respective image, the compensating operation further comprising:
detecting a first systematic error between the first model image and the optical image when inspecting a region of the optical image containing a first edge;
detecting a second systematic error between the second model image and the optical image when inspecting a region of the optical image containing a second edge;

adjusting the first model image to compensate for the first systematic error; and adjusting the second model image to compensate for the second systematic error.

37. A method as recited in claim 33 wherein the first set of transformation functions further comprises:

an optical transfer function configured to incorporate characteristics into the first image that are associated with an image acquisition system used to obtain the optical image of the tritone mask.

38. A method as recited in claim 33 wherein the second set of transformation functions further comprises:

an optical transfer function configured to incorporate characteristics into the first image that are associated with an image acquisition system used to obtain the optical image of the tritone mask.

39. A method as recited in claim 33 wherein the third set of transformation functions further comprises:

an optical transfer function configured to incorporate characteristics into the second image that are associated with an image acquisition system used to obtain the optical image of the tritone mask.

* * * * *